United States Patent
Shen et al.

(10) Patent No.: US 8,981,406 B2
(45) Date of Patent: Mar. 17, 2015

(54) LIGHT EMITTING DIODE DIE AND LIGHT EMITTING DIODE PACKAGE INCORPORATING THE SAME

(71) Applicant: Advanced Optoelectronic Technology, Inc., Hsinchu Hsien (TW)

(72) Inventors: Chia-Hui Shen, Hsinchu (TW); Tzu-Chien Hung, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/862,646

(22) Filed: Apr. 15, 2013

(65) Prior Publication Data

US 2013/0270595 A1 Oct. 17, 2013

(30) Foreign Application Priority Data

Apr. 16, 2012 (CN) .......................... 2012 1 0109929

(51) Int. Cl.
| | | |
|---|---|---|
| *H01L 33/00* | (2010.01) | |
| *H01L 33/62* | (2010.01) | |
| *H01L 33/58* | (2010.01) | |
| *H01L 33/20* | (2010.01) | |
| *H01L 33/38* | (2010.01) | |
| *H01L 33/54* | (2010.01) | |

(52) U.S. Cl.
CPC .............. *H01L 33/62* (2013.01); *H01L 33/58* (2013.01); *H01L 33/20* (2013.01); *H01L 33/38* (2013.01); *H01L 33/54* (2013.01); *H01L 2924/0002* (2013.01)
USPC ............................................... 257/98; 257/99

(58) Field of Classification Search
CPC ......... H01L 33/62; H01L 33/58; H01L 33/20; H01L 33/38; H01L 33/54
USPC ...................................................... 257/98, 99
See application file for complete search history.

(56) References Cited

U.S. PATENT DOCUMENTS

| 8,178,889 B2 * | 5/2012 | Kinoshita et al. ............... 257/98 |
| 2007/0085089 A1 * | 4/2007 | Hsu ................................. 257/81 |
| 2007/0131958 A1 * | 6/2007 | Hsu et al. ........................ 257/99 |
| 2011/0199788 A1 * | 8/2011 | Park ............................. 362/612 |
| 2011/0204395 A1 * | 8/2011 | Hong et al. .................... 257/94 |

* cited by examiner

*Primary Examiner* — Trung Q Dang
(74) *Attorney, Agent, or Firm* — Novak Druce Connolly Bove + Quigg LLP (57) ABSTRACT

An LED die comprises a substrate and an epitaxial layer formed thereon. The epitaxial layer comprises a first n-type semiconductor layer, an active layer and a p-type semiconductor layer grown on the substrate in sequence. The LED die defines a receiving recess formed in a center of a top face of the p-type semiconductor layer. The receiving recess extends through the p-type semiconductor layer, the active layer and into the n-type semiconductor layer along a top-to-bottom direction of the epitaxial layer. A pair of p-pads are located at two opposite sides of the p-type semiconductor layer, respectively. A first n-pad is received in the receiving recess and located on the n-type layer.

10 Claims, 10 Drawing Sheets

FIG. 10

LIGHT EMITTING DIODE DIE AND LIGHT EMITTING DIODE PACKAGE INCORPORATING THE SAME

BACKGROUND

1. Technical Field

The disclosure relates to a light emitting diode (LED) die and an LED package incorporating the same, and particularly to an improved LED die having a broad and uniform light distribution and an LED package incorporating the same.

2. Description of the Related Art

LEDs are solid state-lighting emitting devices formed of semiconductors, which are more stable and reliable than other conventional light sources such as incandescent bulbs. Thus, LEDs are being widely used in various fields such as numeral/character displaying elements, signal lights, light sources for lighting and display devices.

However, a light emitting angle of a traditional LED die/package is less than 120 degrees. And a light distribution of LED die is mostly concentrated at the center while becomes gradually weaker towards the periphery, which results in an un-uniform light distribution.

Therefore, it is desirable to provide an LED die and LED package incorporating the same which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

DETAILED DESCRIPTION

Embodiments of the present disclosure will now be described in detail below, with reference to the accompanying drawings.

Figure 1:
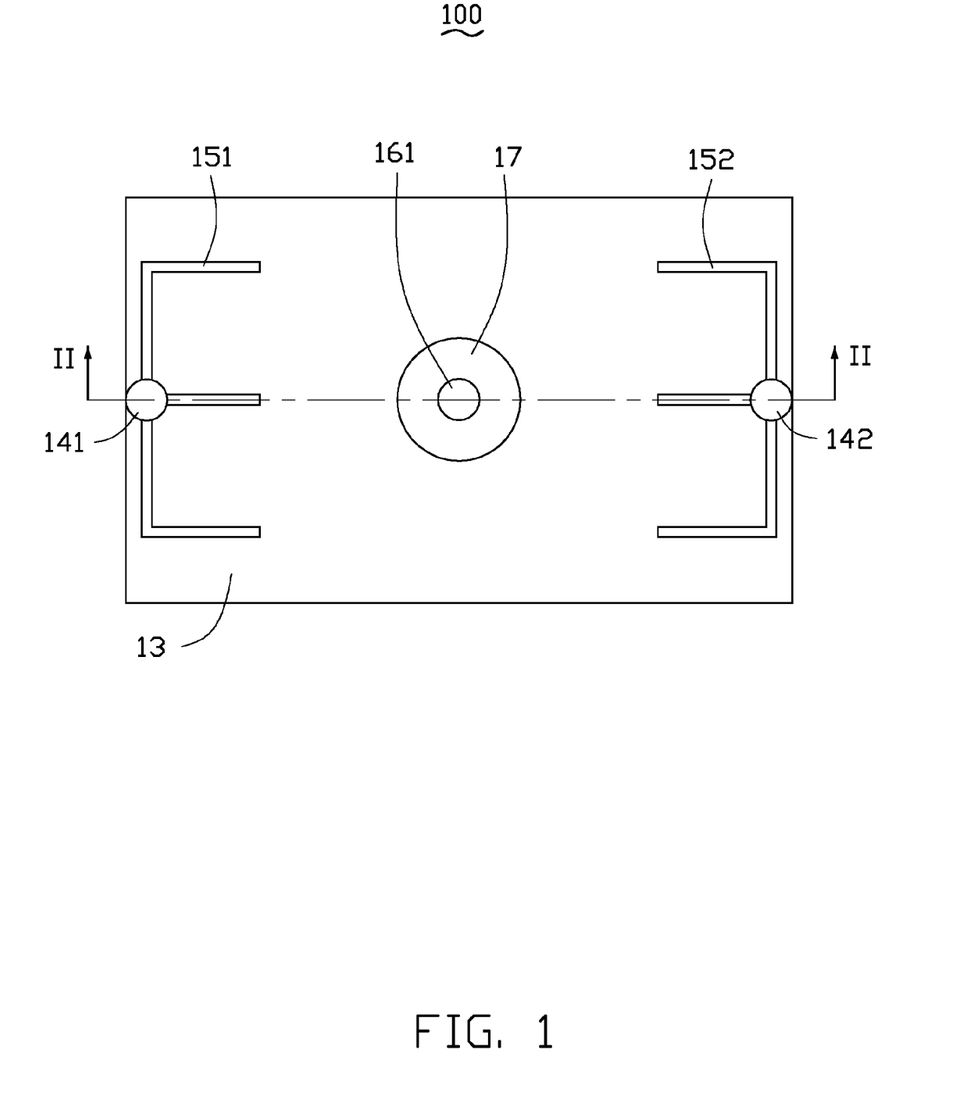
FIG. 1 is a top view of an LED die in accordance with a first embodiment of the present disclosure.
Figure 2:
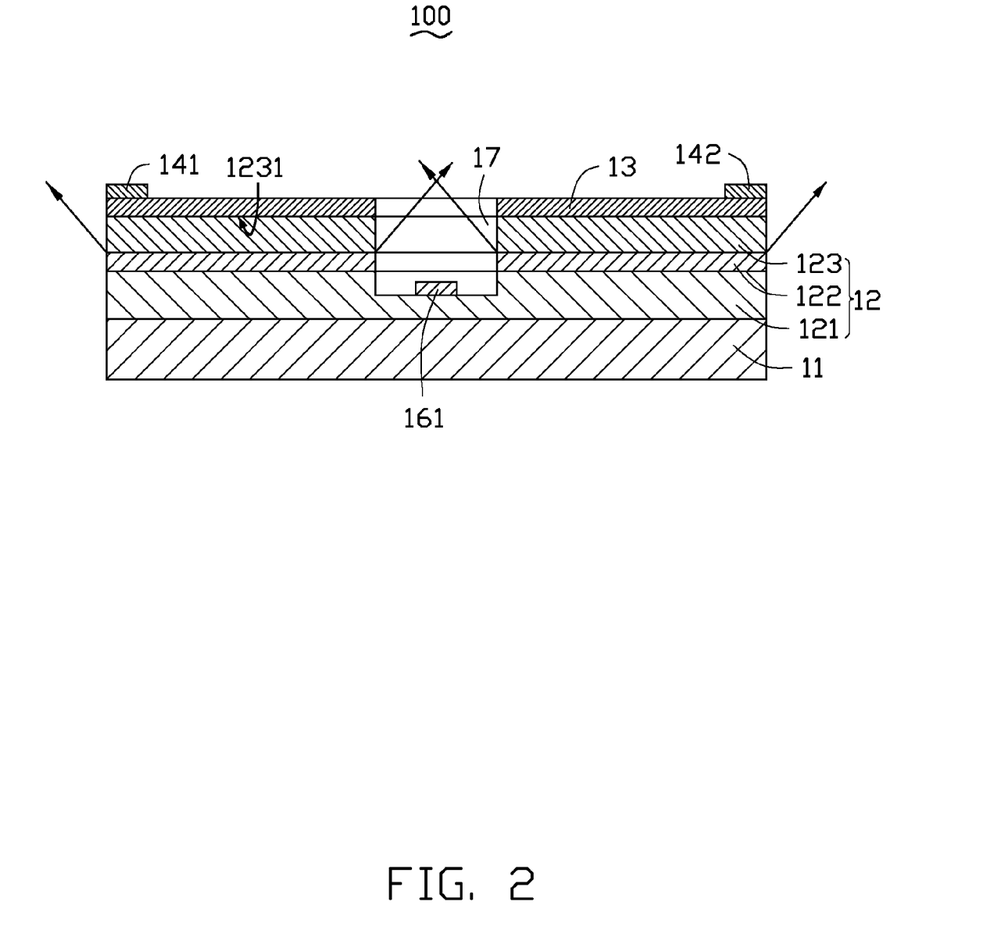
FIG. 2 is a cross-sectional view of the LED die of FIG. 1, taken along line II-II thereof.

Referring to FIGS. 1-2, a light emitting diode (LED) die 100 includes a substrate 11 and an epitaxial layer 12 formed on the substrate 11. The epitaxial layer 12 includes a first n-type semiconductor layer 121, an active layer 122 and a p-type semiconductor layer 122 grown on the substrate 11 in sequence. The epitaxial layer 12 is formed of multi-quantum well structure or single-quantum well structure, wherein the epitaxial layer 12 includes a material selected from the group consisting of InN, InGaN, GaN, AlGaN, and InGaAlN.

The epitaxial layer 12 defines a receiving recess 17 recessed in a center portion of a top face 1231 of the p-type semiconductor layer 123. The receiving recess 17 extends through the p-type semiconductor layer 123, the active layer 122 and into the n-type semiconductor layer 121 along a top-to-bottom direction of the epitaxial layer 12. The receiving recess 17 has a cylinder shape to receive an n-pad 161 therein.

The LED die 100 further include a transparent conductive layer 13 formed on the top face 1231 of the p-type layer 123. The conductive layer 13 covers the p-type layer 123 and surrounds the receiving recess 17. The conductive layer 13 defines a through-hole (not labeled) correspondingly aligned with and communicated with the receiving recess 17.

A pair of p-pads 141, 142 are located at two opposite sides of the conductive layer 13, respectively. An n-pad 161 is received in the receiving recess 17 and located on the n-type semiconductor layer 121. At least a branch 151 is extended outwardly from the p-pad 141 and at least a branch 152 is extended outwardly from the p-pad 142 to spread current across the conductive layer 13. The branches 151, 152 are made of a material selected from a group consisting of Au, Ag, Cu, Al, Sn, Ni, Co, and alloys thereof.

Figure 3:
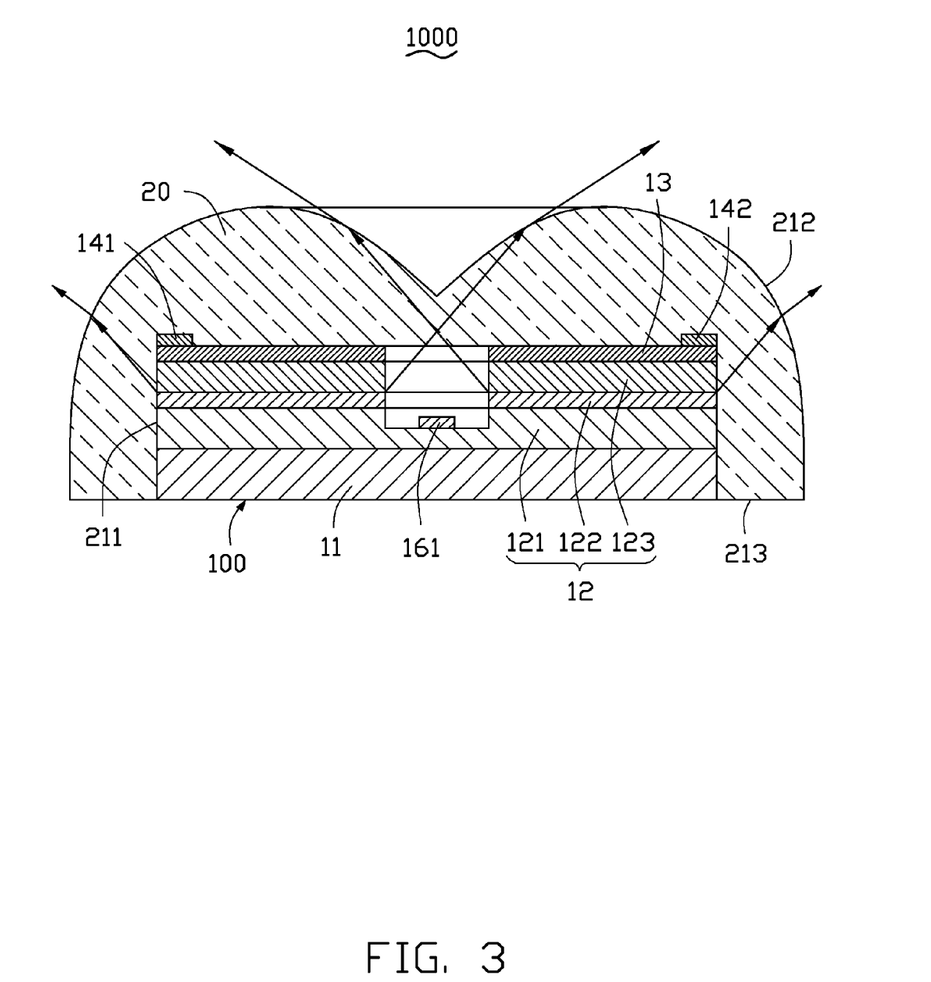
FIG. 3 is a schematic, cross-sectional view of an LED package in accordance with a first embodiment of the present disclosure.

Referring to FIG. 3, a light emitting diode (LED) package 1000 includes an LED die 100 and a symmetrical lens 20 coupled to the LED die 100. The lens 20 increases firstly and then decreases in thickness from a center axis (not shown) to a periphery thereof, wherein the center axis of the lens 20 coincides with the optical axis of the LED die 100.

The lens 20 is made of transparent material, such as silicone, epoxy or glass. In the present embodiment, the lens 20 is made of epoxy resin and formed in a manner of injection molding. The lens 20 includes an incident face 211, a light emitting face 212 and a connecting face 213 interconnecting the incident face 211 and light emitting face 212, wherein the light emitting face 212 is a convex surface having a double-hump shape. In a preferred embodiment, the lens 20 contains phosphor scattered therein to change the color of light emitted from the LED die 100 into a different color. It is understood that the LED package 1000 is electrically connected to the remote power supply (not shown) via wires (not shown).

Figure 4:
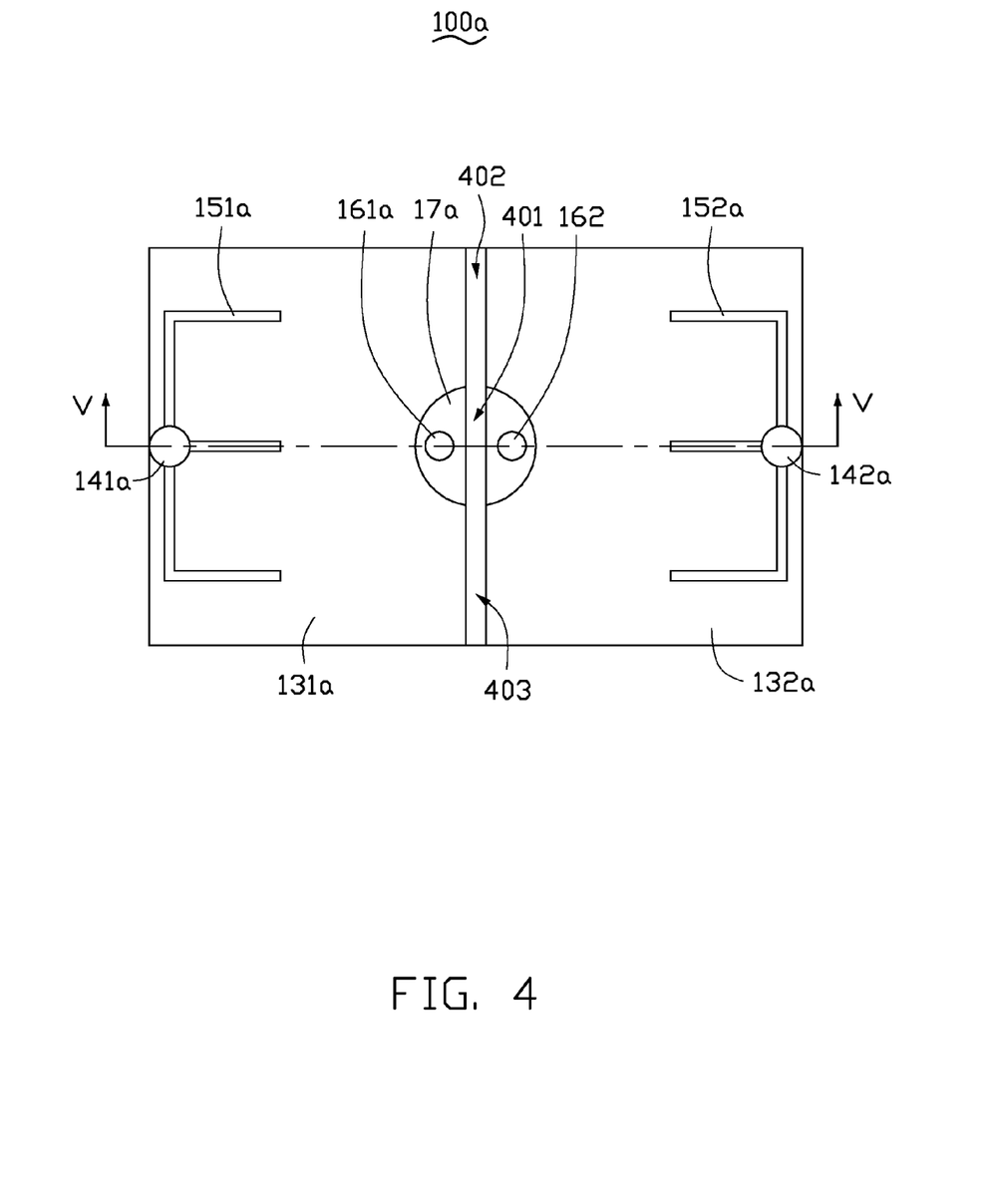
FIG. 4 is a top view of an LED die in accordance with a second embodiment of the present disclosure.
Figure 5:
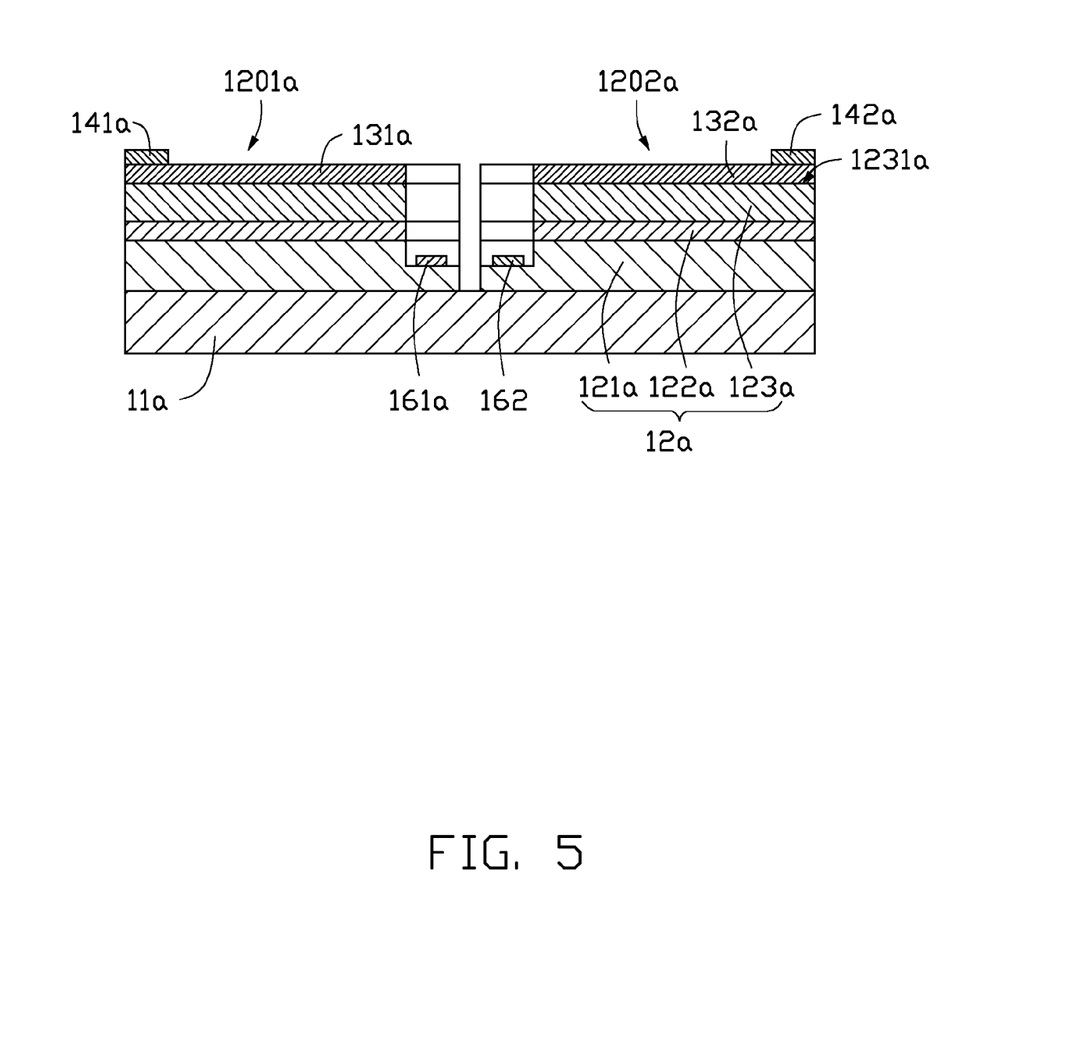
FIG. 5 is a cross-sectional view of the LED die of FIG. 4, taken along line V-V thereof.

Referring to FIGS. 4-5, an LED die 100a in accordance with a second embodiment of this disclosure further defines a narrow slot 40 therein as compared with the LED die 100 in the first embodiment. The slot 40 includes a first portion 401, a second portion 402 extending from a first end (not labeled) of the first portion 401 and a third portion 403 extending from a second end (not labeled) of the first portion 401 opposite to the first end.

The first portion 401 of the slot 40 is formed on the bottom of the receiving recess 17a and extends through the remaining part of the n-type semiconductor layer 121a to reach the substrate 11a. The second and third portions 402, 403 are formed on the top face 1231a of the p-type layer 123a and extend through the epitaxial layer 12a from a top-to-bottom direction, respectively. The epitaxial layer 12a is divided by the slot 40 into a first epitaxial layer portion 1201a and a second epitaxial layer portion 1202a isolated from the first epitaxial layer portion 1201a. The slot 40 extends through two opposite face of the epitaxial layer 12a transversely to communicate with the receiving recess 17a.

The remaining part of the n-type semiconductor layer 121a located at the bottom of the receiving recess 17a is divided by the first portion 401 of the slot 40 into two parts respectively located at two lateral sides of the substrate 11a. A pair of n-pads 161a, 162 are received in the receiving recess 17a and located at the two opposite sides of the remaining part of the n-type semiconductor layer 121a, respectively.

A transparent conductive layer 13a is formed on the top face 1231a of the p-type layer 123a. In the present embodiment, the conductive layer 13a includes a first portion 131a and a second portion 132a isolated from the first portion 131a. The first portion 131a covers on the top face 1231a of the first epitaxial layer portion 1201a, and the second portion 132a covers on the top face 1231a of the second epitaxial layer portion 1202a. The first and second portions 131a, 132a are symmetrical to each other with respect to the slot 40.

Figure 6:
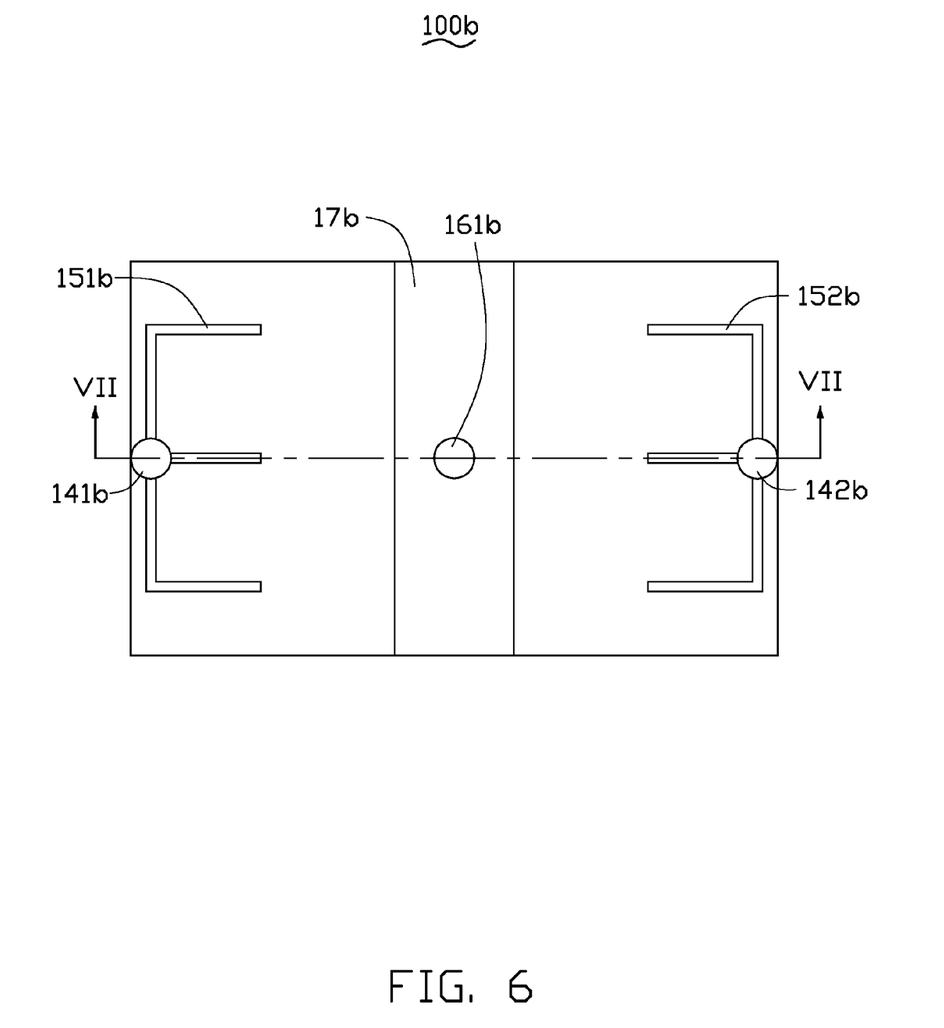
FIG. 6 is a top view of an LED die in accordance with a third embodiment of the present disclosure.
Figure 7:
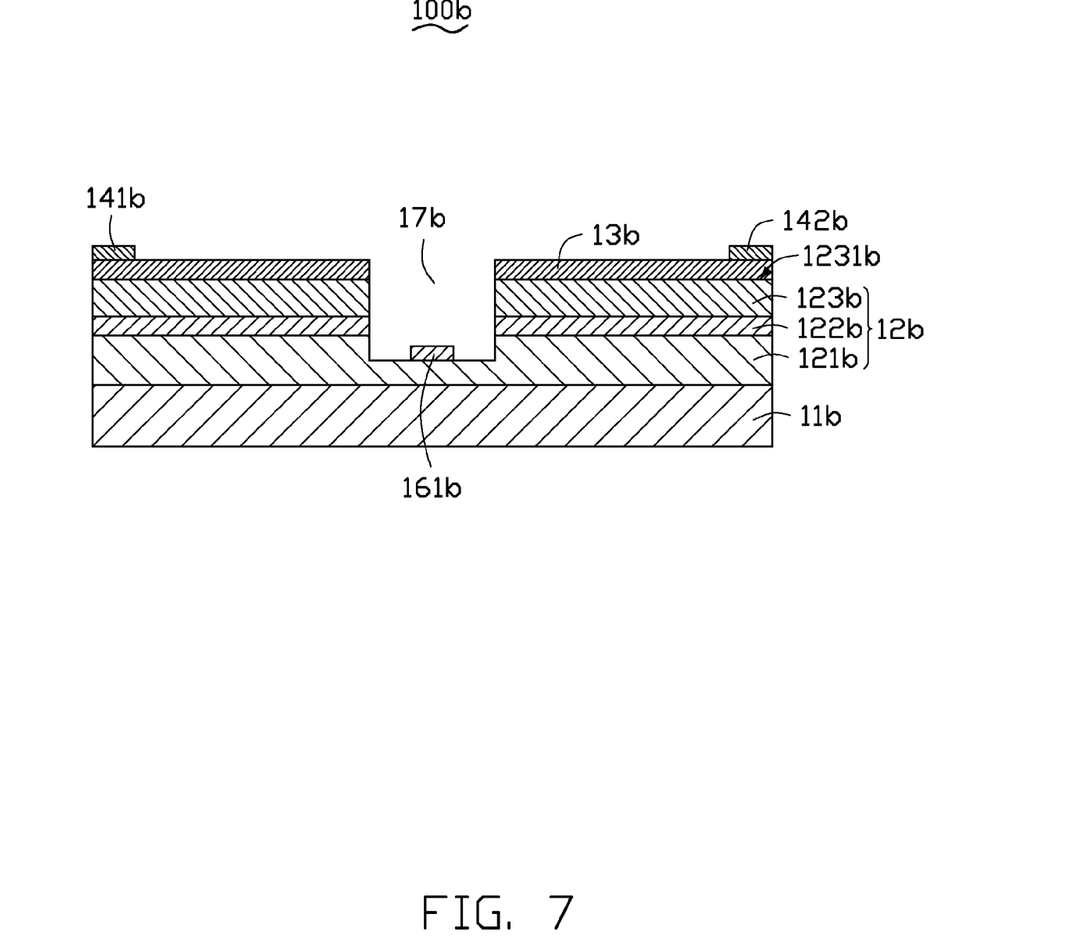
FIG. 7 is a cross-sectional view of the LED die of FIG. 6, taken along line VII-VII thereof.

Referring to FIGS. 6-7, an LED die 100b in accordance with a third embodiment of this disclosure defines a groove 17b therein as compared with the LED die 100 in the first embodiment. The groove 17b is formed on the top face 1231b of the p-type semiconductor layer 123b and extends through the p-type semiconductor layer 123b, the active layer 122b and into the n-type layer 121b along a top-to-bottom direction of the epitaxial layer 12b. The groove 17b transversely extends through two opposite faces of the epitaxial layer 12b. A transparent conductive layer 13b is formed on the top face 1231b of the p-type layer 123b to spread current across the p-type layer 123b.

Figure 8:
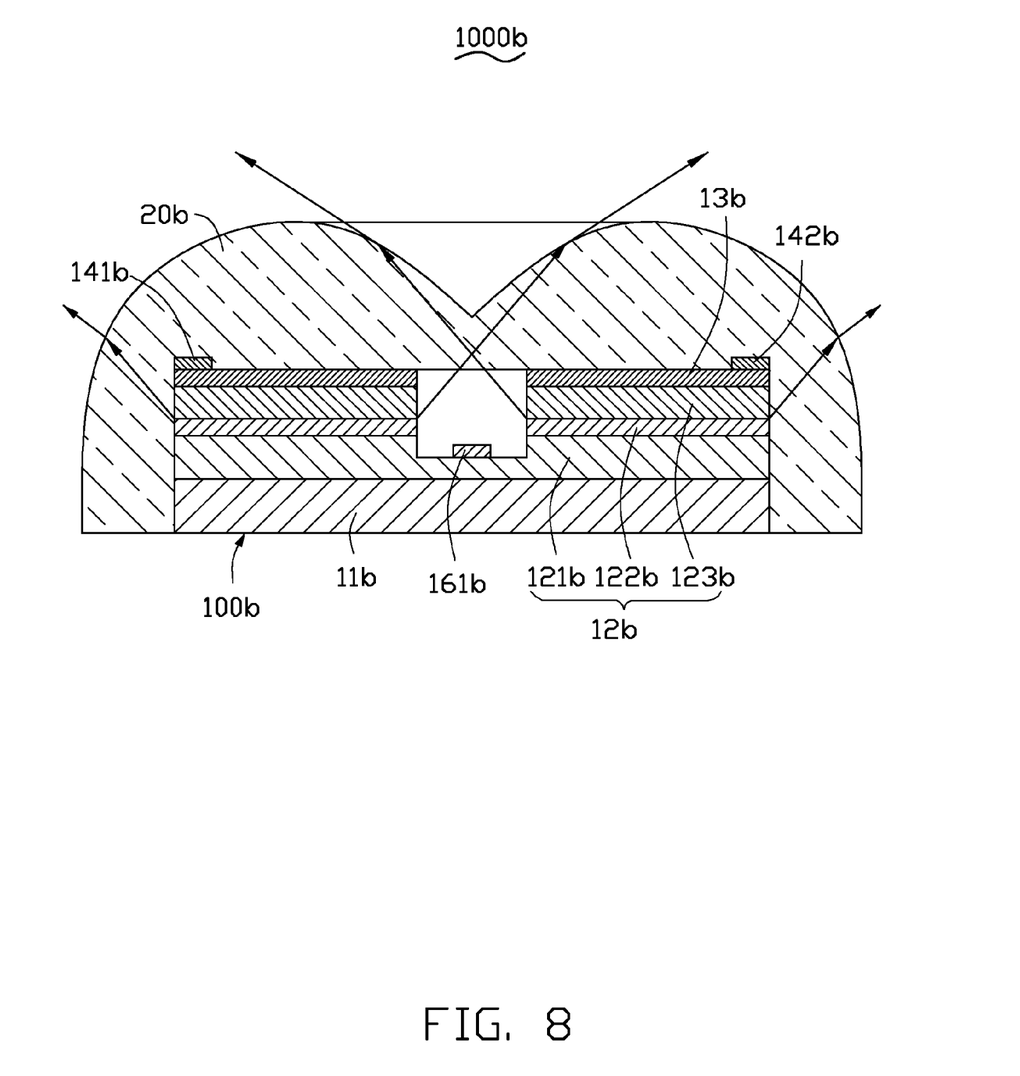
FIG. 8 is a schematic, cross-sectional view of an LED package in accordance with a third embodiment of the present disclosure.

Referring to FIG. 8, a light emitting diode (LED) package 1000b includes an LED die 100b and a lens 20b coupled to the LED die 100b. The lens 20b increases firstly and then decreases in thickness from a center axis to a periphery thereof, wherein the center axis of the lens 20b coincides with the optical axis of the LED die 100b.

Figure 9:
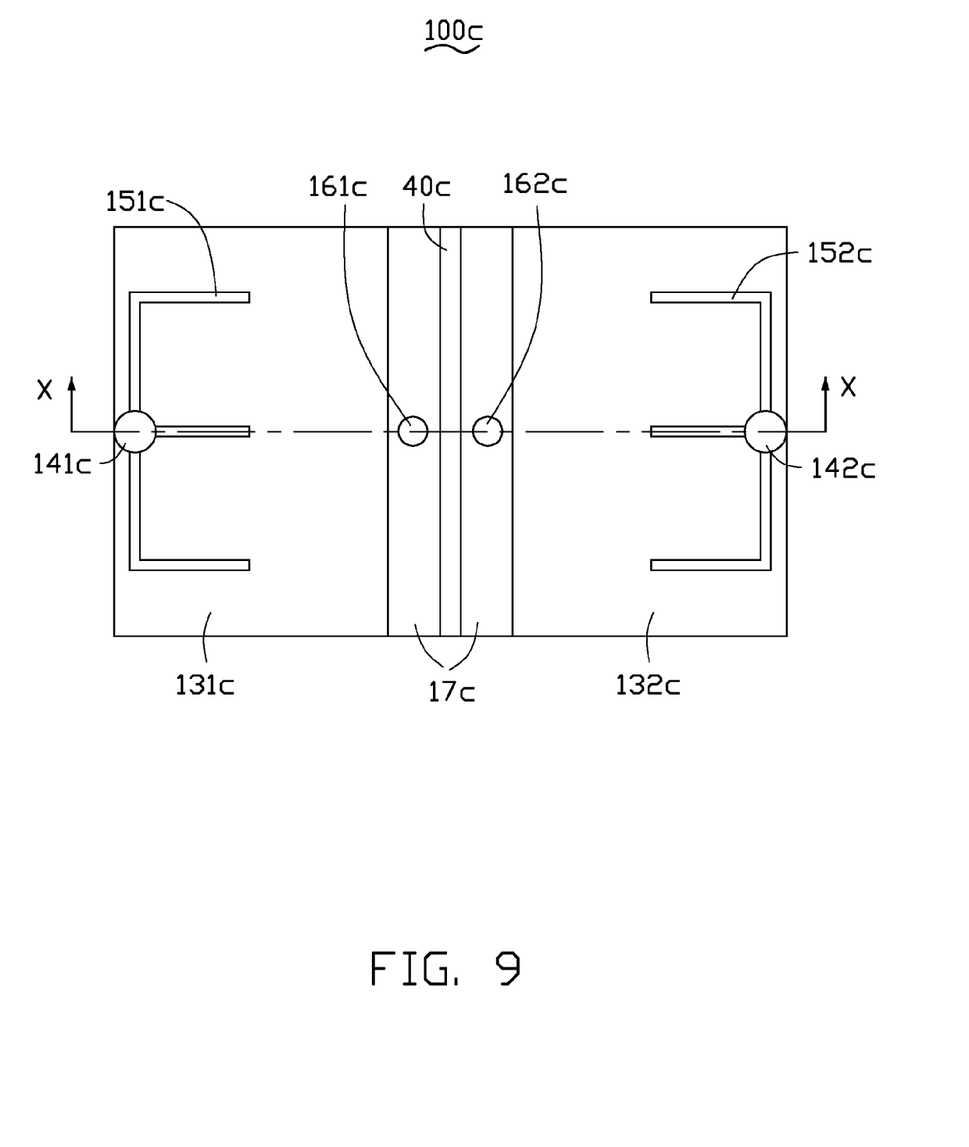
FIG. 9 is a top view of an LED die in accordance with a fourth embodiment of the present disclosure.
Figure 10:
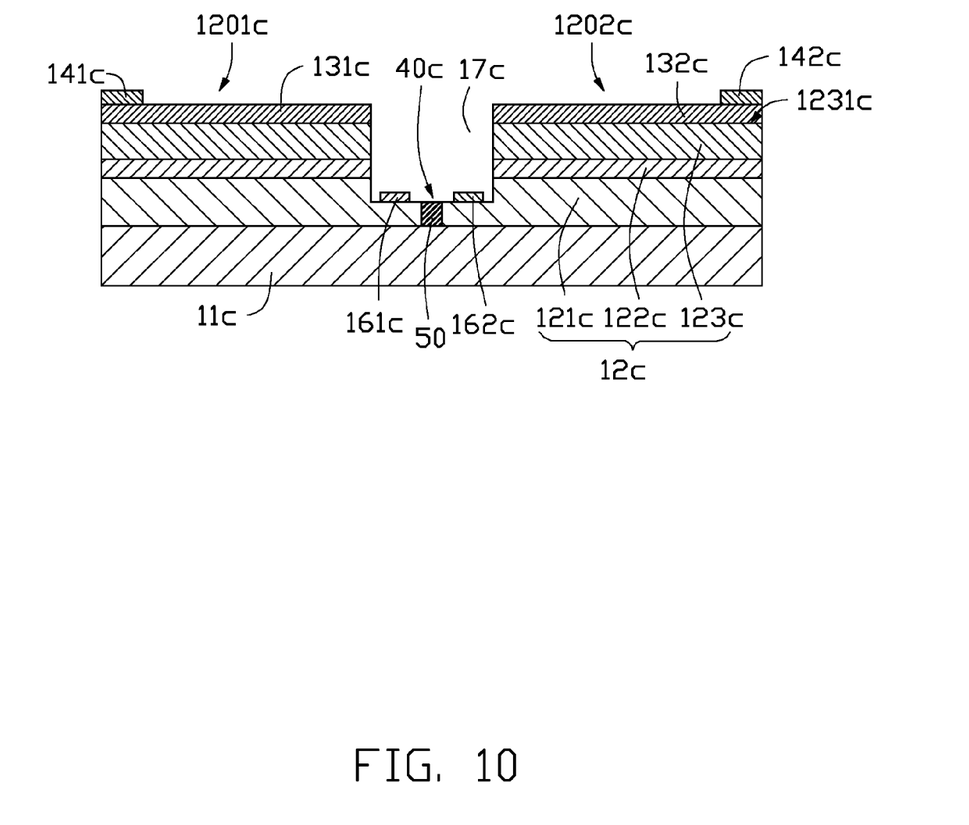
FIG. 10 is a cross-sectional view of the LED die of FIG. 9, taken along line X-X thereof.

Referring to FIGS. 9-10, an LED die 100c in accordance with a fourth embodiment of this disclosure further defines a narrow slot 40c therein as compared with the LED die 100c in the third embodiment. The slot 40c is formed on the bottom of the groove 17c along a middle line of the groove 17c and extends downwardly through the remaining part of the n-type semiconductor layer 121c to reach the substrate 11c. The epitaxial layer 12c is divided by the slot 40c into a first epitaxial layer portion 1201c and a second epitaxial layer portion 1202c located at two lateral sides of the substrate 11c, respectively.

The remaining part of the n-type semiconductor layer 121c located at the bottom of the groove 17c is divided by the slot 40c into two parts respectively located at two lateral sides of the substrate 11c. A first and second n-pads 161c, 162c are received in the groove 17c and located at two opposite sides of the remaining part of the n-type semiconductor layer 121c, respectively. An electrically insulating layer 50 is filled in the slot 40c to electrically insulate the first epitaxial layer portion 1201c from the second epitaxial layer portion 1202c of the epitaxial layer 12c. The electrically insulating layer 50 is coplanar with a top face (not labeled) of the remaining part of the n-type layer 121c located at the bottom of the groove 17c.

In use, when the LED die 100a, 100b, 100c is activated, the light emitted from the LED die 100a, 100b, or 100c towards directly along and concentrates near the optical axis thereof are weakened by the active layer 122a, 122b, 122c. Thus, the LED die 100a, 100b, 100c having a uniform light distribution is obtained.

The lens 20, 20b helps spreading the light intensity emitted from the emitting surface (not labeled) of the LED die 100, 100b over a large area surrounding the emitting surface, thus the LED package 1000, 1000b having a broad and uniform light distribution is obtained.

It is understood that a first epitaxial layer portion 1201a and a second epitaxial layer portion 1202a in the second embodiment could be electrically connected to the remote power supply (not shown) in series or separately. And a first epitaxial layer portion 1201c and a second epitaxial layer portion 1202c in the fourth embodiment could be electrically connected to the remote power supply (not shown) in series or separately.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode (LED) die, comprising:
    a substrate;
    an epitaxial layer, the epitaxial layer comprising a first n-type semiconductor layer, an active layer and a p-type semiconductor layer grown on the substrate in sequence;
    a receiving recess, the receiving recess formed in a center of a top face of the p-type semiconductor layer and extending through the p-type semiconductor layer, the active layer and into the n-type semiconductor layer along a top-to-bottom direction of the epitaxial layer;
    a pair of p-pads located at two opposite sides of the p-type semiconductor layer, respectively;
    a first n-pad received in the receiving recess and located on the n-type layer;
    wherein the LED die further defines a narrow slot formed in the epitaxial layer;
    wherein the slot extends through two opposite face of the epitaxial layer transversely to communicate with the receiving recess and divides the epitaxial layer into a first epitaxial layer portion and a second epitaxial layer portion isolated from the first epitaxial layer portion;
    wherein the receiving recess has a cylinder shape and the remaining part of the n-type semiconductor layer located at the bottom of the receiving recess is divided by the slot into two parts respectively located at two lateral sides of the substrate; and
    wherein a second n-pad is also received in the receiving recess, wherein the first n-pad is located on one of two parts of the remaining part of the n-type semiconductor layer within the receiving recess and the second n-pad is located on the other part of the remaining part of the n-type semiconductor layer within the receiving recess.

2. The LED die of claim 1, wherein the slot comprises a first portion, a second portion extending from a first end of the first portion and a third portion extending from a second end of the first portion opposite to the first end.

3. The LED die of claim 2, wherein the first portion of the slot is formed at the bottom of the receiving recess and extends downwardly through the remaining part of the n-type layer to the substrate.

4. The LED die of claim 2, wherein the second and third portions are formed on the top face of the p-type layer and extend through the epitaxial layer from a top-to-bottom direction to the substrate, respectively.

5. The LED die of claim 3, wherein the remaining part of the n-type semiconductor layer located at the bottom of the receiving recess is divided by the first portion of the slot into two parts respectively located at two lateral sides of the substrate.

6. The LED die of claim 5, further comprising a second n-pad received in the receiving recess, wherein the first n-pad is located on a first part of the remaining part of the n-type semiconductor layer and the second n-pad is located on a second part of the remaining part of the n-type semiconductor layer opposite to the first part.

7. A light emitting diode (LED) package, comprising:
an LED die, the LED die comprising:
a substrate;
an epitaxial layer, the epitaxial layer comprising a first n-type semiconductor layer, an active layer and a p-type semiconductor layer grown on the substrate in sequence;
a receiving recess, the receiving recess recessed in a center of a top face of the p-type semiconductor layer and extending through the p-type semiconductor layer, the active layer and into the n-type semiconductor layer along a top-to-bottom direction of the epitaxial layer;
a pair of p-pads located at two opposite sides of the p-type semiconductor layer, respectively; and
a first n-pad received in the receiving recess and located on the n-type layer; and
an optical lens coupled to the LED die;
wherein the lens firstly increases and then decreases in thickness from a center to a periphery thereof;
wherein the receiving recess has a cylinder shape and the remaining part of the n-type semiconductor layer located at the bottom of the receiving recess is divided by the slot into two parts respectively located at two lateral sides of the substrate; and
wherein a second n-pad is also received in the receiving recess, wherein the first n-pad is located on one of two parts of the remaining part of the n-type semiconductor layer within the receiving recess and the second n-pad is located on the other part of the remaining part of the n-type semiconductor layer within the receiving recess.

8. The LED package of claim 7, wherein the lens comprises an incident face, a light emitting face and a connecting face interconnecting the incident face and the light emitting face, and the light emitting face is a convex surface having a double-hump shape.

9. The LED die of claim 1, wherein multiple braches are extended radially outward from each p-pad to spread current across the conductive layer.

10. The LED package of claim 7, wherein multiple braches are extended radially outward from each p-pad to spread current across the conductive layer.

* * * * *